United States Patent
Jung-Suk

Patent Number: 5,262,664
Date of Patent: Nov. 16, 1993

[54] PROCESS FOR FORMATION OF LDD TRANSISTOR, AND STRUCTURE THEREOF

[75] Inventor: Goo Jung-Suk, Seoul, Rep. of Korea

[73] Assignee: Goldstar Electron Co., Ltd., Rep. of Korea

[21] Appl. No.: 8,096

[22] Filed: Jan. 22, 1993

Related U.S. Application Data

[63] Continuation of Ser. No. 719,837, Jun. 24, 1991, abandoned.

[30] Foreign Application Priority Data

Jun. 30, 1990 [KR] Rep. of Korea ............... 90-9896

[51] Int. Cl.⁵ ............... H01L 29/10; H01L 29/78
[52] U.S. Cl. ............... 257/344; 257/345; 257/409
[58] Field of Search ............... 357/23.3, 23.8; 257/344, 345, 409

[56] References Cited

U.S. PATENT DOCUMENTS

| | | | |
|---|---|---|---|
| 4,771,014 | 9/1988 | Liou et al. | 437/41 |
| 4,968,639 | 11/1990 | Bergonzoni | 437/57 |
| 5,023,190 | 6/1991 | Lee et al. | 437/56 |
| 5,061,649 | 10/1991 | Takenouchi et al. | 437/44 |
| 5,102,816 | 4/1992 | Manukonda et al. | 437/44 |

FOREIGN PATENT DOCUMENTS

62-130563  6/1987  Japan ............... 357/23.3

Primary Examiner—Andrew J. James
Assistant Examiner—Donald L. Monin, Jr.
Attorney, Agent, or Firm—Blakely, Sokoloff, Taylor & Zafman

[57] ABSTRACT

A process for formation of an LDD transistor and a structure thereof are disclosed in which the junction capacitance and the body effect can be properly reduced. In the conventional LDD transistors, the punch-through problem is serious, and in the improved conventional LDD transistor also, there is a limit in increaseing the channel concentration, as well as the body effect being increased. The present invention gives solutions to the above problems by arranging that the junction thicknesses of n+ source and drain become smaller than the junction thicknesses of n− regions, and that a p type pocket 6 be formed only near a gate and a p type pocket 6.

1 Claim, 4 Drawing Sheets

PROCESS FOR FORMATION OF LDD TRANSISTOR, AND STRUCTURE THEREOF

This is a continuation of application Ser. No. 07/719,837 filed Jun. 24, 1991, now abandoned.

FIELD OF THE INVENTION

The present invention relates to a process for formation of an LDD transistor and a structure thereof, and particularly to a process for formation of an LDD transistor and a structure thereof, in which the body effect and the junction capacitance can be suitably reduced.

BACKGROUND OF THE INVENTION

The structures of the conventional LDD transistors are illustrated in FIGS. 1 and 2. The LDD transistor of FIG. 1 is manufactured in the manner described below. That is, a gate oxide layer 3 is grown on a p type substrate 1, and then, a gate 4 is formed by depositing polysilicon. Then a p type pocket 6 and an n⁻ region 7 are formed by ion-implanting boron and phosphorous respectively, and then, a side wall spacer 11 is formed by performing a reactive ion etching after depositing a low temperature oxide layer. Then arsenic (As) is ion-implanted to form am n⁺ region 8, thereby forming an LDD transistor.

Meanwhile, the LDD transistor of FIG. 2 is manufactured in the manner described below. That is, boron ions are implanted using a mask only into the portion of a channel 12 of a p type substrate 1, and then, a gate oxide layer 3 is grown on the substrate 1. Then a gate 4 is formed by despositing polysilicon, and then, an n⁻ region 6 is formed by ion-implanting phosphorus. Then a side wall spacer 11 is formed by carrying out a reactive ion etching after depositing a low temperature oxide layer, and then, arsenic (As) is ion-implanted to form an n⁺ region 8, thereby forming an LDD transistor.

In the LDD transistors manufactured in the manners described above, while the sizes of the transistors are reduced, the problem of the punch-through becomes serious. In an attempt to overcome this problem, a p type pocketing is provided or the concentration of the channel 12 is increased on the source and drain regions 7,8. However, in the case where p type pocketings are provided to the source and drain regions, there arises the p type substrate is increased due to the existance of the p type pocket 6.

Meanwhile, in the case where the concentration of the channel is increased, there is a limit in the threshold voltage Vt, and therefore, there is a limit in increasing the channel concentration. Further, even if the threshold voltage Vt is maintained at a proper level, there is the problem that the body effect (the variation of Vt due to the back bias) is increased.

SUMMARY OF THE INVENTION

Therefore it is the object of the present invention to provide a process for formation of an LDD transistor and a structure thereof, in which all the above described disadvantages are solved.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
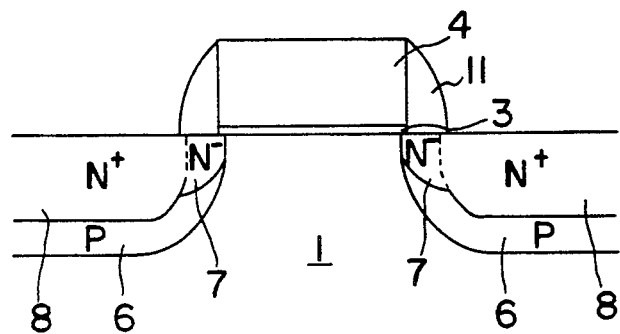
FIGS. 1 and 2 illustrate the structures of the conventional LDD transistors.
Figure 2:
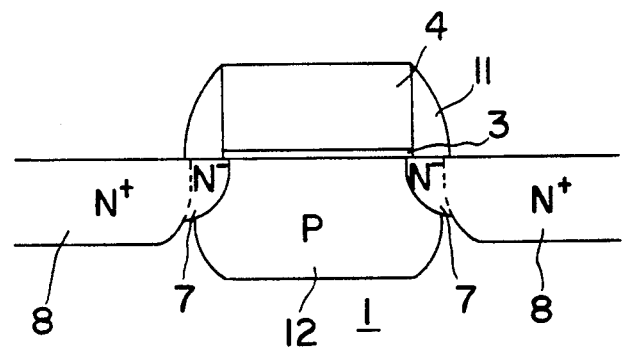
Figure 3A:
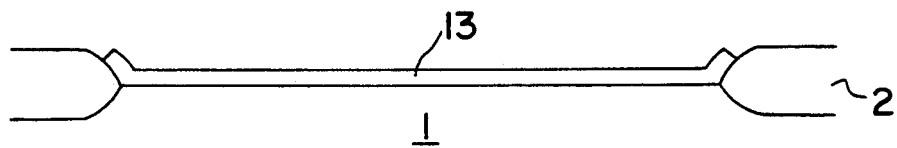
FIGS. 3A to 3G illustrate the process for the formation of the LDD transistor according to the present invention.
Figure 3B:
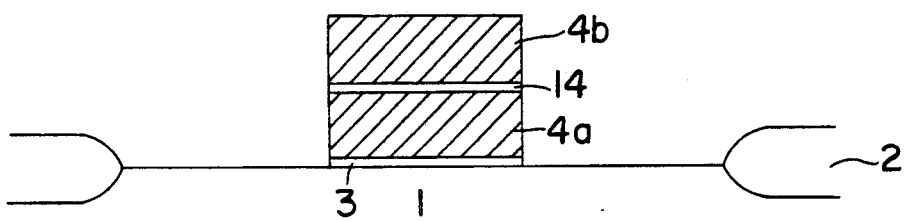
Figure 3C:
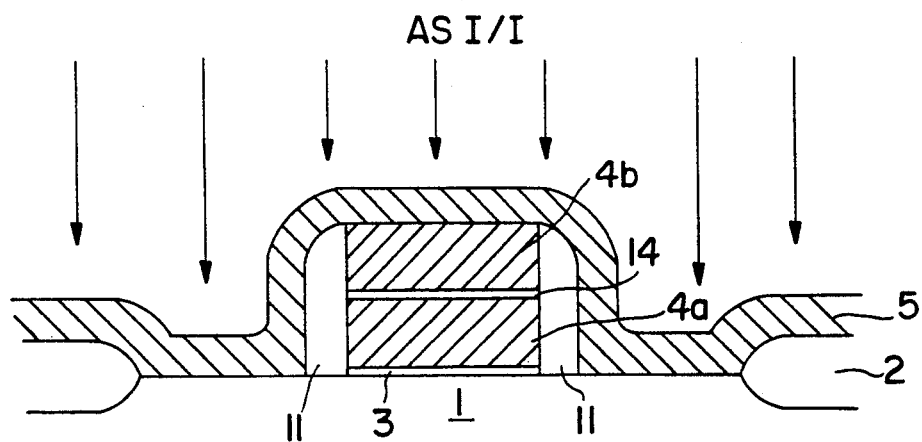

As shown in FIG. 3A, a nitride rayer 13 is deposited on a p type substrate 1, and then, a field oxide layer 2 is formed after carrying out an etching using a mask on the portion of the nitride layer 13 where the field oxide layer is to be formed. Then as shown in FIG. 3B, a gate oxide layer 3 is grown after removing the nitride layer 13, and then, a poly 4a, a nitride layer 14 and a poly 4b are successively deposited on the gate oxide layer 3, with a gate being formed by applying a mask thereafter. Then, as shown in FIG. 3C, a side wall spacer 11 is formed, an undoped poly 5 is deposited thereupon, and then, an impurity (an element having a valence value 5 such as arsenic or phosphorus) is ion-implanted.

Figure 3D:
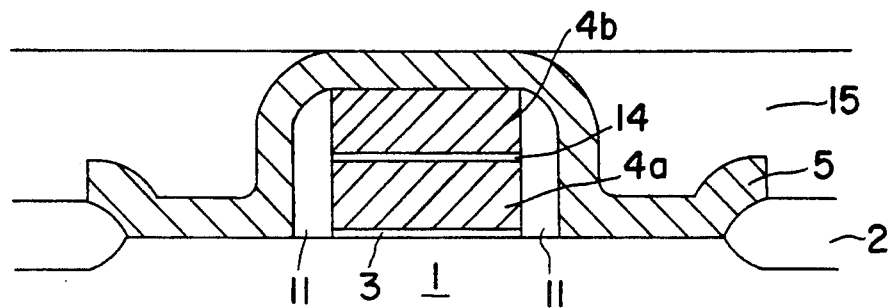
Figure 3E:
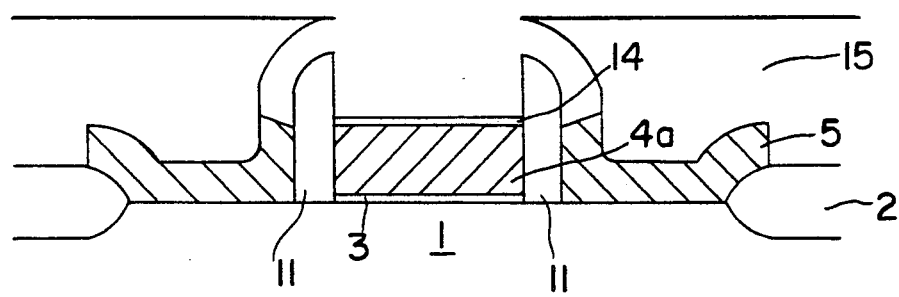
Figure 3F:
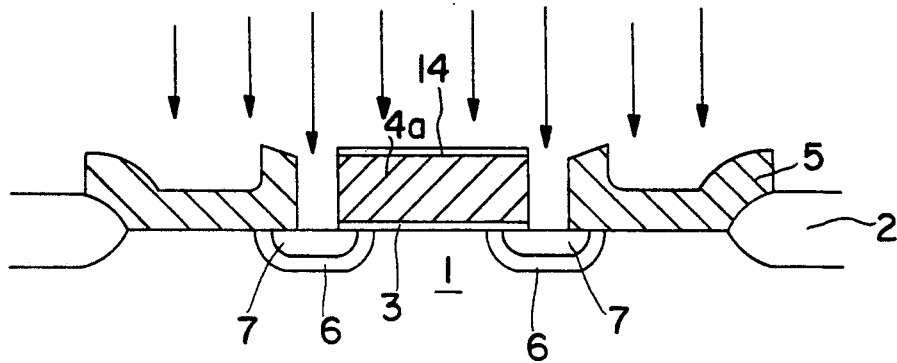
Figure 3G:
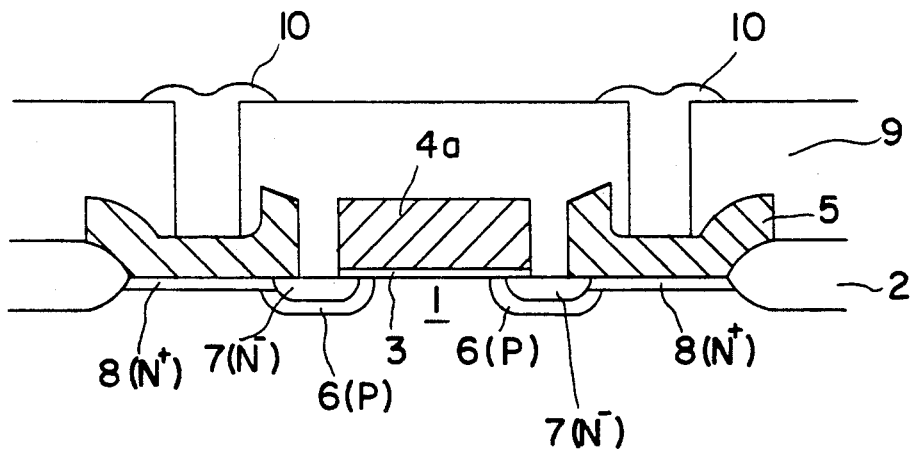

Then as shown in FIG. 3D, the poly 5 is sheared off using a mask except a part of it positioned upon the gate and field oxide layer 2. Then a photoresist 15 is spread, and then, a flattening is carried out by performing an etch-back until the poly 5 is exposed. As shown in FIG. 3E, the polies 4b and 5 are etched in a stepped-up selection rate until the nitride layer 14 is exposed. As shown in FIG. 3F, the side wall spacer 11 is etched, and the photoresist 15 is removed. Further, a p type pocket 6 is formed by ion-implanting an impurity (an element having a valence value 3 such as boron or BF2) into the portion where the side wall spacer 11 was positioned, and then, an n⁻ region 7 is formed by ion-implanting an impurity (an element having a valence value 5 such as arsenic or phosphorus). Then as shown in FIG. 3G, an insulating layer (SOG,BPSG) 9 is filled, and a finishing treatment is performed, thereby forming an n⁻ region 8 having a shallow impurity region diffused from the poly 5.

Then, a contact is drilled, and a metal 10 is deposited. Then, interconnections are carried out, thereby forming an LDD transistor.

In the LDD transistor formed through the process described above, the high concentration p type portion exists only near the gate which is the end portion of the source and drain. Therefore, the junction capacitances of the source and drain as well as the body effect can be reduced, thereby improving the operating characteristics of the transistor, and also improving the chip speed.

What is claimed is:

1. A structure of an LDD transistor comprising:
   a p-type substrate;
   a field oxide layer formed on a first surface of said p-type substrate;
   a gate oxide layer and a gate poly formed on said first surface of p-type substrate;
   poly formed on said first surface of p-type substrate at both sides of said gate poly at intervals with said gate poly;
   an n⁺ region formed in said p-type substrate underlying said poly;
   an n⁻ region formed adjacent to said n⁺ region and formed in junction depth deeper than said n⁺ region;
   a p⁺ pocket region formed in said p-type substrate in a manner to surround only said n⁻ region;
   an insulating material formed over said first surface of said p-type substrate, covering said field oxide layer, said gate oxide layer and said poly; and
   a metal electrode formed by drilling a contact through said insulating material over said poly.

* * * * *